United States Patent
Henry et al.

(10) Patent No.: US 10,651,048 B1
(45) Date of Patent: May 12, 2020

(54) SCAIN ETCH MASK FOR HIGHLY SELECTIVE ETCHING

(71) Applicant: National Technology & Engineering Solutions of Sandia, LLC, Albuquerque, NM (US)

(72) Inventors: Michael David Henry, Albuquerque, NM (US); Travis Ryan Young, Albuquerque, NM (US); Erica Ann Douglas, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/537,953

(22) Filed: Aug. 12, 2019

Related U.S. Application Data

(60) Provisional application No. 62/723,715, filed on Aug. 28, 2018.

(51) Int. Cl.

| | | |
|---|---|---|
| *H01L 21/321* | (2006.01) | |
| *H01L 21/3213* | (2006.01) | |
| *H01L 23/532* | (2006.01) | |
| *H01L 21/02* | (2006.01) | |
| *H01L 21/687* | (2006.01) | |

(52) U.S. Cl.
CPC .. *H01L 21/32133* (2013.01); *H01L 21/02271* (2013.01); *H01L 21/68778* (2013.01); *H01L 23/53214* (2013.01)

(58) Field of Classification Search
CPC .................................................. H01L 21/32133
See application file for complete search history.

(56) References Cited

U.S. PATENT DOCUMENTS

2018/0130883 A1* 5/2018 Hardy ............... H01L 21/02378

OTHER PUBLICATIONS

Henry, M. D. et al., "Reactive sputter deposition of piezoelectric Sc0.12Al0.88N for contour mode resonators," J. Vac. Sci. Technolo. (2018) 36(3) 8 pages.

* cited by examiner

*Primary Examiner* — Roberts P Culbert
(74) *Attorney, Agent, or Firm* — Mark A. Dodd

(57) ABSTRACT

A fabrication process employing the use of ScAlN as an etch mask is disclosed. The ScAlN etch mask is chemically nonvolatile in fluorine-based etch chemistries and has a low sputter yield, resulting in greater etch mask selectivity and reduced surface roughness for silicon and other semiconductor materials. The ScAlN etch mask has an etch mask selectivity of greater than 200,000:1 relative to silicon compared to an etch mask selectivity of less than 40,000:1 for a prior art AlN etch mask relative to silicon. Further, due to reduced sputtering of the ScAlN etch mask, and thus reduced micromasking, the ScAlN etch mask yielded a surface roughness of 0.6 μm compared to a surface roughness of 2.8 μm for an AlN etch mask.

17 Claims, 5 Drawing Sheets

SCAlN ETCH MASK FOR HIGHLY SELECTIVE ETCHING

CROSS-REFERENCE TO RELATED APPLICATION

This application claims the benefit of U.S. Provisional Application No. 62/723,715, filed Aug. 28, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a ScAlN etch mask for use in semiconductor fabrication that exhibits a high etch mask selectivity and a low etch mask sputtering rate.

BACKGROUND

Silicon continues to play an important role in many technologies including CMOS, microelectromechanical systems (MEMSs), and wafer level packaging, as well as a substrate for emerging technologies such as piezoelectrics. One of the fundamental aspects which makes silicon so advantageous is the ability to sculpt bulk silicon to create structures using deep reactive ion etching (DRIE) techniques. Plasma etch techniques for the rapid etching of silicon, with etch rates above 1 µm/min, include cryogenic etching and time multiplexed processes where $SF_6$ provides substantial improvements over $Cl_2$- or HBr-based etches. One of the key aspects for successful device fabrication using fluorine-based DRIE is the utilization of etch masks which have a high etch mask selectivity relative to silicon. High selectivity in etch masks reduces undesired artifacts in etch profiles such as sidewall tapering, while also enabling the use of thinner etch mask films. Minimizing the etch mask thickness reduces the amount of wafer bow induced by film stress and results in a shorter deposition time. Thus, there is a need to develop higher selectivity etch masks to enable new technology with more difficult plasma etching requirements.

Etch mask selectivity is typically controlled by two major etching mechanisms in plasma etch techniques: chemical etching and physical sputtering. Utilization of fluorine-based chemistries offers significant etch mask selectivity improvement since silicon and germanium are energetically favorable to react with fluorine to produce volatile silicon tetrafluoride ($SiF_4$) and germanium tetrafluoride ($GeF_4$). Etch masks which do not chemically react with fluorine, such as Cr, Ni, Al, Ga, and $Al_2O_3$, have higher selectivity to silicon than those that can react with fluorine to produce volatile compounds, such as Ta, Nb, Ti, and W. For nonreactive etch mask materials, neutrals and radicals in the etching processes are less important to etch mask selectivity than ion impingement.

One approach to improving the selectivity of nonreactive etch mask materials is to reduce the ion impingement. DRIE techniques can be tuned to have low impingement chemistries that only lightly accelerate the plasma created ions, reduce the ion flux, and dramatically reduce the sputter yield of the etch mask. A lower sputter yield ($\gamma_s$) and lower ion flux ($j_{ion}$) dramatically reduce the etch mask erosion rate (dZ/dt), given in Eq. (1):

$$\frac{dZ}{dt} = \frac{W}{\rho N_A e} \times \gamma_s \times j_{ion} \qquad (1)$$

where W and $\rho$ are the atomic weight and density of the etch mask material and $N_A$ and e are Avogadro's constant and electron charge. Using sputter yield values of 1.34, 1.34, and 0.18 for Ni, $SiO_2$, and $Al_2O_3$, a reduction of etch mask etch rate per ion current density [(dZ/dt) per $j_{ion}$] can be predicted with values of $9.3 \times 10^{-5}$, $3.6 \times 10^{-4}$, and $4.8 \times 10^{-5}$, respectively, yielding roughly a factor of 8 improvement when utilizing $Al_2O_3$ in place of $SiO_2$. This improvement has been experimentally measured multiple times, enabling deeper and higher aspect ratio structures in silicon. With fluorine-based etch chemistries, reaction products for Ni and Al containing etch masks are nonvolatile NiF and AlF, respectively. This is helpful for etch mask selectivity, but it results in micromasking of silicon due to etch mask sputtering and redeposition of the etch mask material and its nonvolatile reaction products.

Micromasking results in unwanted spikes of silicon as the etch progresses, as shown in FIGS. 3A and 3B, which illustrate micromasking from the use of prior art $Al_2O_3$ and AlN etch masks, respectively. Although all etch masks have some amount of sputtering, a wide range of sputtering characteristics exist based on the etch mask material, etch chemistry, and etch bias. Typically, to compensate for etch mask sputtering, plasma etch bias is reduced, which consequently reduces both the etch mask sputtering and the silicon etch rate.

Thus, there exists a need for an etch mask for DRIE that would be chemically nonvolatile in fluorine-based etch chemistries while also having a low sputter yield and creating a high etch mask selectivity relative to silicon and other semiconductor materials. This low sputter yield of the etch mask would also reduce the micromasking effect.

SUMMARY

One aspect of the present invention relates to the use of ScAlN as an etch mask that is chemically nonvolatile in fluorine-based etch chemistries and has a low sputter yield, thereby creating a high etch mask selectivity relative to silicon and other semiconductor materials.

At least one embodiment of the present invention employs the following process steps:
1. Providing a substrate.
2. Forming a layer of ScAlN etch mask material on a surface of the substrate.
3. Forming a ScAlN etch mask with at least one opening from the layer of ScAlN etch mask material.
4. Etching the substrate through the at least one opening in the ScAlN etch mask using a fluorine-based etch chemistry.
5. Removing the ScAlN etch mask.

In various embodiments of the present invention: the substrate is a semiconductor wafer, a processed semiconductor wafer, or a composite wafer; the layer of ScAlN etch mask material is deposited by physical vapor deposition or metal organic chemical vapor deposition; the layer of ScAlN etch mask material is deposited by sputtering a single ScAl target or co-sputtering separate Sc and Al targets; the layer of ScAlN etch mask material is formed by depositing a high compressive stress layer of ScAlN and then a low compressive stress layer of ScAlN on the high compressive stress layer of ScAlN; the layer of ScAlN etch mask material includes at least approximately 12.5% Sc; and the thickness of the layer of ScAlN etch mask material is between approximately 3 nm and approximately 10 µm or at least approximately 3 nm.

In various embodiments of the present invention: forming the ScAlN etch mask includes spinning a layer of photoresist onto the layer of ScAlN etch mask material, exposing the layer of photoresist, developing the exposed layer of photoresist, and removing the exposed portion of the layer of ScAlN etch mask material; using reactive ion etching, tetramethylammonium hydroxide-based wet chemistry etching, or KOH-based wet chemistry etching to remove the exposed portion of the layer of ScAlN etch mask material; using a chlorine-based chemistry process, a gas switching time multiplexed mode process, or a Bosch process to remove the exposed portion of the layer of ScAlN etch mask material; using reactive ion etching to etch the substrate through the ScAlN etch mask; using a deep reactive ion etching process, a gas switching time multiplexed mode process, or a Bosch process to etch the substrate through the ScAlN etch mask; using backside He cooling of the substrate during etching of the substrate; etching the substrate to form a physical feature or a physical element in the substrate; etching completely through the substrate; and removing the ScAlN etch mask using a tetramethylammonium hydroxide-based chemistry or a KOH-based chemistry.

Various embodiments of the present invention include: a semiconductor die with a physical feature or a physical element, the physical feature or physical element formed by forming a layer of ScAlN etch mask material on the semiconductor die, forming a ScAlN etch mask with at least one opening from the layer of ScAlN etch mask material, etching the semiconductor die through the at least one opening in the ScAlN etch mask using a fluorine-based etch chemistry, and removing the ScAlN etch mask; the semiconductor being a semiconductor integrated circuit die or a microelectromechanical system die; and a semiconductor die formed by forming a layer of ScAlN etch mask material on a surface of the semiconductor die, forming a ScAlN etch mask with an opening around a perimeter of the semiconductor die from the layer of ScAlN etch mask material, etching through the perimeter of the semiconductor die through the opening in the ScAlN etch mask using a fluorine-based etch chemistry, and removing the ScAlN etch mask.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Fabrication Process

Figure 1A:
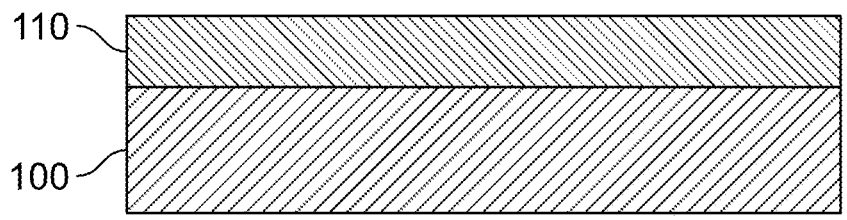
FIGS. 1A-1F illustrate a fabrication sequence in accordance with one or more embodiments of the present invention.

FIGS. 1A-1F illustrate a fabrication sequence in accordance with one or more embodiments of the present invention. In FIG. 1A, a ScAlN etch mask material layer 110 is deposited on a substrate 100. The substrate 100 may be any suitable substrate including a semiconductor wafer, for example a silicon (Si), germanium (Ge), or silicon carbide (SiC) wafer; a processed semiconductor wafer with one or more integrated circuits and/or one or more microelectromechanical systems (MEMSs) formed thereon; or a composite wafer, for example a semiconductor-on-insulator (SOI) wafer.

The ScAlN etch mask material layer 110 may be formed by any suitable method. In some embodiments, the ScAlN etch mask material layer 110 may be deposited by physical vapor deposition (PVD), while in other embodiments the ScAlN etch mask material layer 110 may be deposited by metalorganic chemical vapor deposition (MOCVD). PVD may take many forms, including sputtering or evaporation of the material used to form the ScAlN etch mask material layer 110. In a preferred embodiment, the ScAlN etch mask material layer 110 is deposited by reactive sputtering from a single ScAl target, with $N_2$ and Ar as the process gases. In alternative embodiments, the ScAlN etch mask material layer 110 is deposited by co-sputtering, in which separate Sc and Al targets are used, with $N_2$ and Ar as the process gases.

The ScAlN etch mask material layer 110 may have any suitable composition. In some embodiments, employing the preferred deposition technique of reactive sputtering from a single ScAl target, the ScAlN etch mask material layer 110 has a composition of $Sc_{0.125}Al_{0.875}N$ or $Sc_{0.2}Al_{0.8}N$. A higher Sc concentration may be preferred as these compositions will likely have lower etch and sputter rates. The specific composition selected will also be a function of how difficult it is to remove the ScAlN etch mask when the substrate etching is completed. Currently, single ScAl targets for sputtering are available at Sc concentrations of 12.5% and 20%, though targets with higher scandium concentrations may soon be available.

The ScAlN etch mask material layer 110 may have any suitable thickness. While a ScAlN etch mask material layer 110 having a thickness of approximately 740 nm has been used experimentally, thicknesses from 20 nm to 1 µm, or from 3 nm to 10 µm, may be employed in alternative embodiments, with the thinnest ScAlN etch mask material layer 110 benefiting from higher Sc concentrations. A thinner ScAlN etch mask material layer 110 offers a number of benefits. A thinner ScAlN etch mask material layer 110 results in a higher fidelity feature transfer to the ScAlN etch mask material layer 110 to form the ScAlN etch mask 130 as well as a higher fidelity feature transfer from the ScAlN etch mask 130 to the underlying substrate 100 during the substrate etching step. Similarly, a thinner ScAlN etch mask material layer 110 also makes removal of the ScAlN etch mask 130 easier upon completion of the substrate etching process. Further, a thinner ScAlN etch mask material layer 110 will reduce wafer bowing and deposition time. However, if the ScAlN etch mask material layer 110 is too thin, then it will not withstand the substrate etching process due to, among other factors, sputtering of the ScAlN etch mask 130 by the impinging ion flux jinn during the substrate etching step.

A thicker ScAlN etch mask material layer 110 will require careful attention to the growth parameters, especially RF power when sputtering, as stress can readily lead to the formation of inclusions within the material. See Michael D. Henry et al., "Reactive sputter deposition of piezoelectric $Sc_{0.12}Al_{0.88}N$ for contour mode resonators," J. Vac. Sci. Tech. B 36(3) 03E104-1 (2018), the contents of which are incorporated herein by reference. To avoid the formation of inclusions within a thicker sputtered ScAlN etch mask material layer 110, a dual-layer ScAlN structure may be employed. This dual-layer ScAlN structure comprises a first high compressive stress layer of ScAlN, for example, a compressive stress of at least 500 MPa, followed by a second low compressive stress layer of ScAlN, for example with a compressive stress of less than 300 MPa. The ratio of the sputter time for the high compressive stress layer of ScAlN to the sputter time for the low compressive stress layer of ScAlN should be greater than approximately 0.05 for minimizing the number of inclusions in a thicker ScAlN etch mask material layer 110.

Figure 1B:
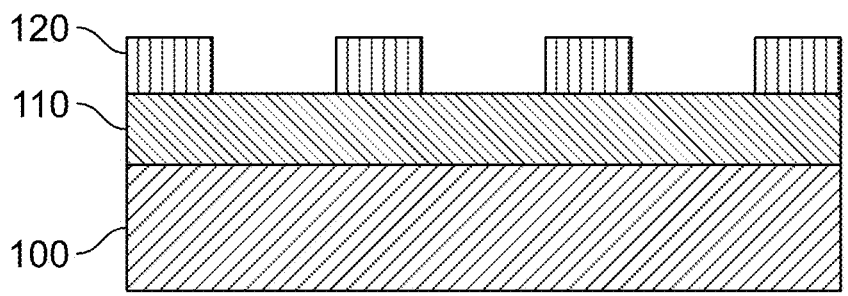

In FIG. 1B, a photoresist layer 120 is spun onto the ScAlN etch mask material layer 110. The photoresist layer 120 is then exposed and developed in accordance with well-known methods in the semiconductor fabrication industry.

Figure 1C:
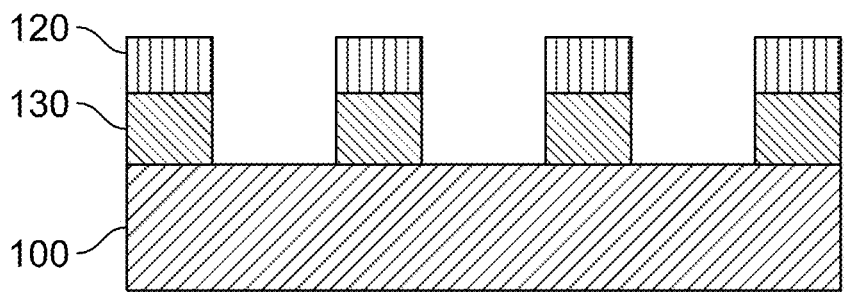

In FIG. 1C, the pattern of the photoresist layer 120 is transferred to the exposed portions of the ScAlN etch mask material layer 110 through an etching process. Any suitable etching method may be used to transfer the pattern of the photoresist layer 120 to the ScAlN etch mask material layer 110. In some embodiments, a subtractive etching process is used. This subtractive etching process preferably uses an inductively coupled plasma reactive ion etch (ICP RIE) employing a chlorine-based gas chemistry, for example, $BCl_3$ and $Cl_2$ (12 and 30 sccm, respectively) with ICP powers of 1000 W and 200 W, respectively, at a pressure of 1.8 mTorr. This subtractive etching process may alternatively be based upon a wet etch process. This wet etching process may employ, for example, the photoresist developers AZ 3XXMIF and AZ 4XXK, which are tetramethylammonium hydroxide- and KOH-based chemistries.

Figure 1D:
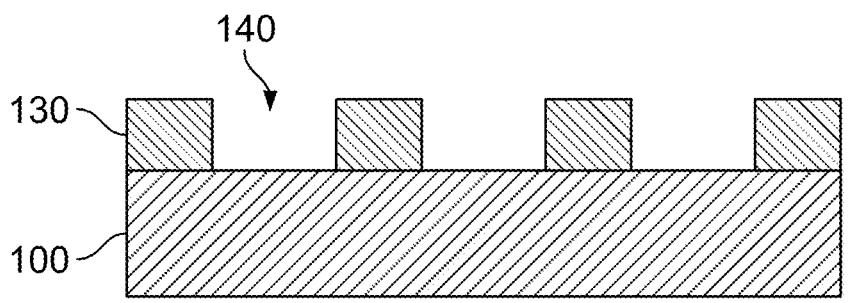

The photoresist layer 120 is removed after its pattern has been transferred to the ScAlN etch mask material layer 110, resulting in the ScAlN etch mask 130 with openings 140 therethrough as illustrated in FIG. 1D.

While the process illustrated in FIGS. 1A-1D employs etching of the ScAlN etch mask material layer 110 to form the ScAlN etch mask 130, other processes may be used in other embodiments. For example, a lift-off process may be employed in which the photoresist layer 120 is formed and patterned prior to the step of depositing the ScAlN etch mask material layer 110. The portions of the ScAlN etch mask material layer 110 formed on the patterned photoresist layer 120 are then lifted-off, leaving behind the desired ScAlN etch mask 130.

Figure 1E:
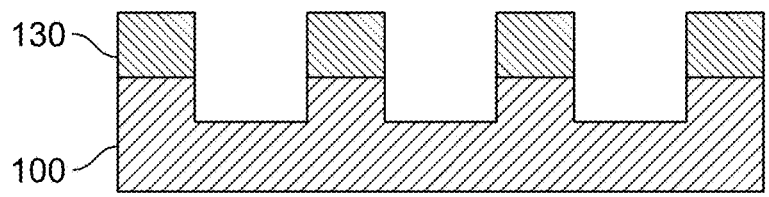

In FIG. 1E, the portions of the substrate 100 below the openings 140 in the ScAlN etch mask 130 are etched. Any suitable fluorine-based etching method may be used to etch the substrate 100. In a preferred embodiment, the etching method is deep reactive ion etching (DRIE) employing a gas switching time multiplexed mode process, i.e., the Bosch process, with backside He cooling. The first step in this preferred Bosch process is polymer deposition using $C_4F_8$, the second step (etch-A) is a high bias step with $SF_6$ and Ar to clear the deposited polymer from horizontal surfaces, and the third step (etch-B) is a low bias $SF_6$ based silicon etch. These process parameters are shown in Table 1. While the following working examples all employed fluorine-based etch chemistries for their respective etch processes, other etch chemistries may be employed depending upon the material being etched.

TABLE 1

| | DRIE etch conditions. | | | | | | |
|---|---|---|---|---|---|---|---|
| Step | ICP (W) | Bias (V) | $SF_6$ (sccm) | $C_4F_8$ (sccm) | Ar (sccm) | Pressure (mTorr) | Time (s) |
| Dep | 2000 | 10 | 0 | 150 | 30 | 25 | 1.8 |
| Etch-A | 2000 | variable | 250 | 0 | 30 | 40 | 2.1 |
| Etch-B | 3000 | 10 | 450 | 0 | 30 | 60 | 2.0 |

As discussed below, the bias in the etch-A portion of the process has a significant impact on the overall etching characteristics, and thus is noted as variable in Table 1.

Figure 1F:

In FIG. 1F, the ScAlN etch mask 130 has been removed, leaving behind the etched substrate 100. Any suitable removal process may be used to remove the ScAlN etch mask 130. In some embodiments, photoresist developers were employed for removing the ScAlN etch mask 130. For example, both AZ 3XXMIF and AZ 4XXK, which are tetramethylammonium hydroxide- and KOH-based chemistries, respectively, successfully removed the ScAlN etch mask 130. The wet etch rate of the ScAlN etch mask 130 for AZ 321MIF and AZ 400K were 7.0 nm/min and 21 nm/min, respectively, for a $Sc_{0.125}Al_{0.875}N$ etch mask 130. Similarly, the wet etch rate of the ScAlN etch mask 130 for AZ 300MIF and AZ 421K were 1.7 nm/min and 2.4 nm/min, respectively, for a $Sc_{0.2}Al_{0.8}N$ etch mask 130. In each case, there was limited or no damage to the substrate 100.

A ScAlN etch mask may be used as part of any desired semiconductor fabrication process. For example, in some embodiments, the ScAlN etch mask may be used in etching various physical features, e.g., a trench, a mesa, or a fin, in a semiconductor integrated circuit die. In other embodiments, the ScAlN etch mask may be used in etching various physical elements, e.g., a resonator, a gear, a comb drive, or a cantilever, in a MEMS die. In still other embodiments, the ScAlN etch mask may be used to etch completely through a semiconductor wafer as part of a singulation process to separate the individual die formed on the semiconductor wafer or for forming through silicon vias (TSVs) for advanced packaging processes.

Working Examples

The following discussion provides results from three sets of experiments, the first comparing a ScAlN etch mask with Al$_2$O$_3$ and AlN etch masks when etching Si, the second comparing etching results as a function of etching process parameters for ScAlN etch masks when etching Si, and the third applying the use of a ScAlN etch mask when etching SiC.

Figure 2:
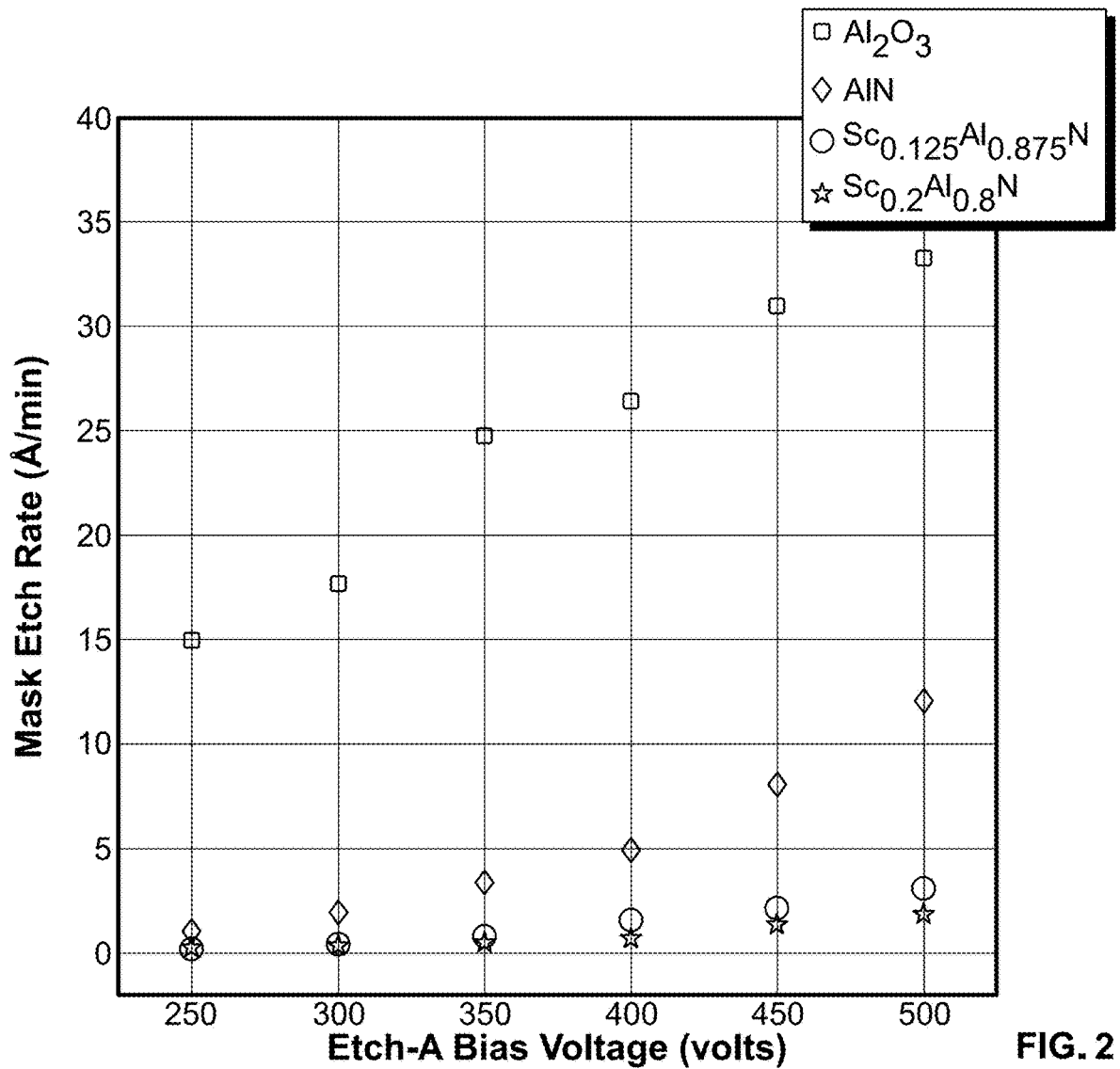
FIG. 2 illustrates the experimental etch mask etch rates for $Al_2O_3$, AlN, and ScAlN etch masks in accordance with one or more embodiments of the present invention.

In the first experiment, the etch mask etch rate, the etch mask selectivity relative to silicon, and the surface roughness from micromasking for etch masks made of Sc$_{0.125}$Al$_{0.875}$N, Sc$_{0.2}$Al$_{0.8}$N, Al$_2$O$_3$, and AlN were determined. FIG. 2 illustrates the etch mask etch rate relative to silicon for all four etch mask materials as a function of the etch-A bias voltage, one of the more significant factors affecting etch mask etch rate. As reflected in FIG. 2, all four etch mask materials had increasing etch mask etch rates as the etch-A bias increased, though the etch mask etch rates for both the Sc$_{0.125}$Al$_{0.875}$N and Sc$_{0.2}$Al$_{0.8}$N etch mask materials were approximately a factor of ten less than the rate for Al$_2$O$_3$, with the rate for AlN falling between that of ScAlN and Al$_2$O$_3$. It should be noted that for the lowest etch-A biases, the thicknesses of the two ScAlN etch masks appeared to increase (the mask etch rates were negative). This anomaly is attributed to ellipsometer resolution when measuring small etch mask losses, spatial resolution of the post-etch measurement, or residual polymer or fluorination on the etch mask surface. Because the mask etch rates are so low under these low etch-A biases, a very thin ScAlN etch mask may be used, resulting in very high fidelity feature transfer to the underlying substrate.

Based upon the etch mask etch rates illustrated in FIG. 2, and the corresponding measured silicon wafer etch rates, etch mask selectivities of 2150:1, 5720:1, 23,550:1 and 39,500:1 for Al$_2$O$_3$, AlN, Sc$_{0.125}$Al$_{0.875}$N, and Sc$_{0.2}$Al$_{0.8}$N, respectively, were obtained at an etch-A bias of 500V. When the etch-A bias was reduced to 300 volts, the etch mask selectivities increased to 3880:1, 36,380:1, 164,290:1, and 209,100:1 for Al$_2$O$_3$, AlN, Sc$_{0.125}$Al$_{0.875}$N, and Sc$_{0.2}$Al$_{0.8}$N respectively. These very high etch mask selectivities for ScAlN provide significant improvements in MEMS manufacturing, wafer level packaging, and plasma dicing of silicon wafers.

Figure 3A:
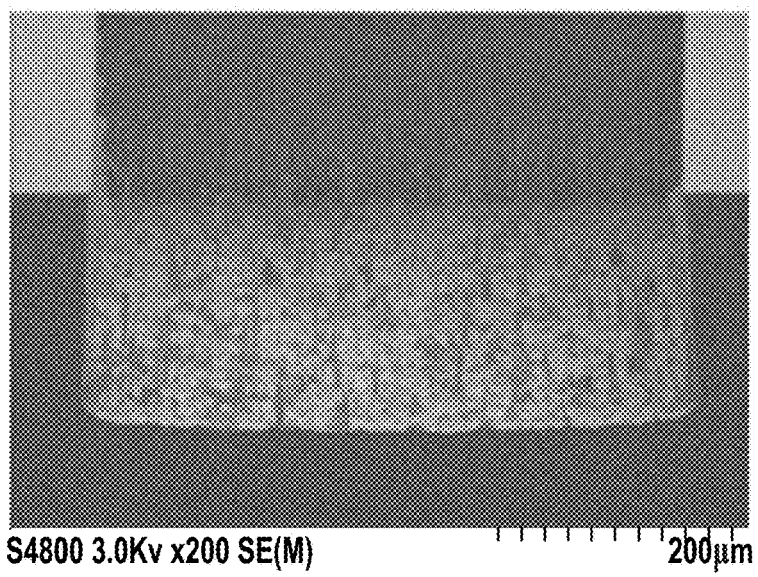
FIGS. 3A-3C are photomicrographs of experimental 500 µm square openings etched into silicon substrates with $Al_2O_3$, AlN, and ScAlN etch masks, respectively, in accordance with one or more embodiments of the present invention.
Figure 3B:
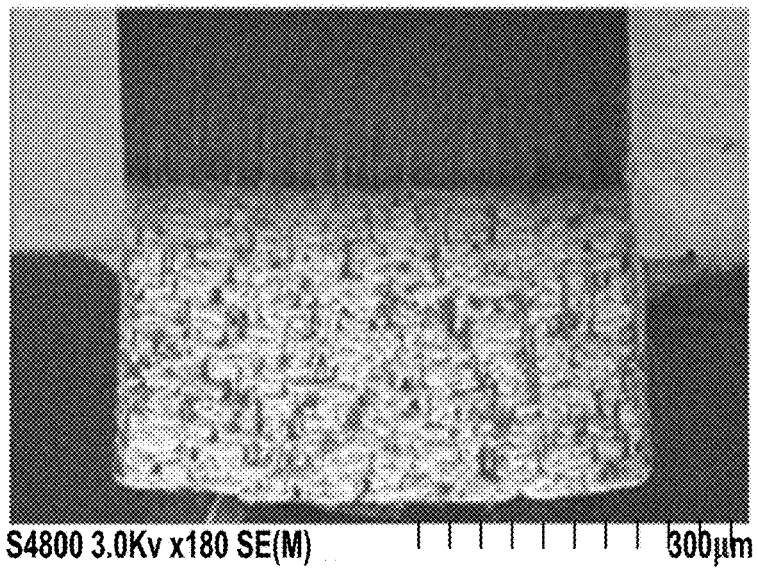
Figure 3C:
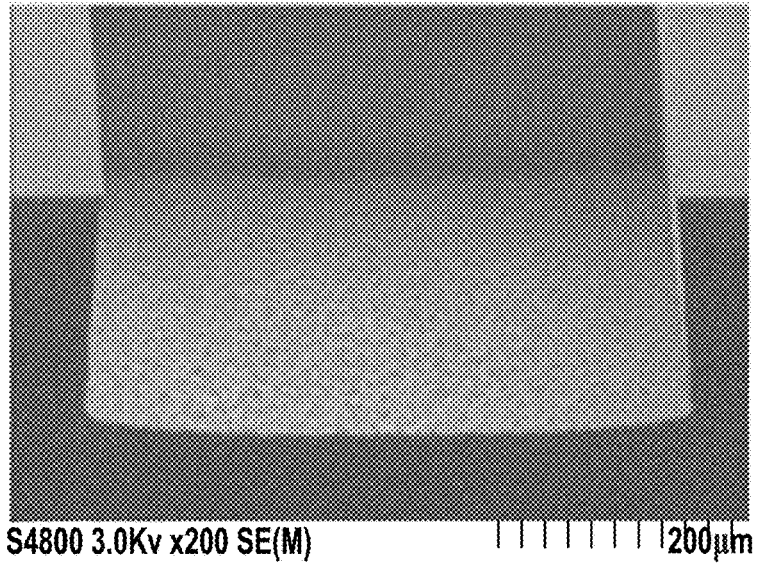

FIGS. 3A-3C are photomicrographs of 500 μm square openings etched into silicon substrates with Al$_2$O$_3$, AlN, and Sc$_{0.125}$Al$_{0.875}$N etch masks, respectively, at an etch-A bias of 500V after 30 minutes. While all three figures show some micromasking in the etched openings due to sputtering of the etch mask material, the opening etched through the Sc$_{0.125}$Al$_{0.875}$N etch mask shows significantly fewer micromasking features, indicating far less sputtering of the Sc$_{0.125}$Al$_{0.875}$N etch mask. Optical confocal measurements of the surface roughness within the etched openings showed RMS roughnesses of 2.7 μm, 2.8 μm, and 0.6 μm, for the Al$_2$O$_3$, AlN, and Sc$_{0.125}$Al$_{0.875}$N etch masks, respectively. The low sputtering of the Sc$_{0.125}$Al$_{0.875}$N etch mask is attributed to the Sc substitution for Al, as Sc has an atomic weight of 44.96, while Al has an atomic weight of 26.98.

Because the ScAlN etch mask is being used as an etch mask, and not a buried etch stop layer, the low sputtering rate of the ScAlN etch mask is a significant benefit. In contrast, a low sputtering rate is not a requirement for a buried etch stop layer, and thus any of Al$_2$O$_3$, AlN, or ScAlN may be used as a buried etch stop layer. Stated another way, materials that perform well as buried etch stop layers will not necessarily perform well as etch mask layers.

Figure 4:
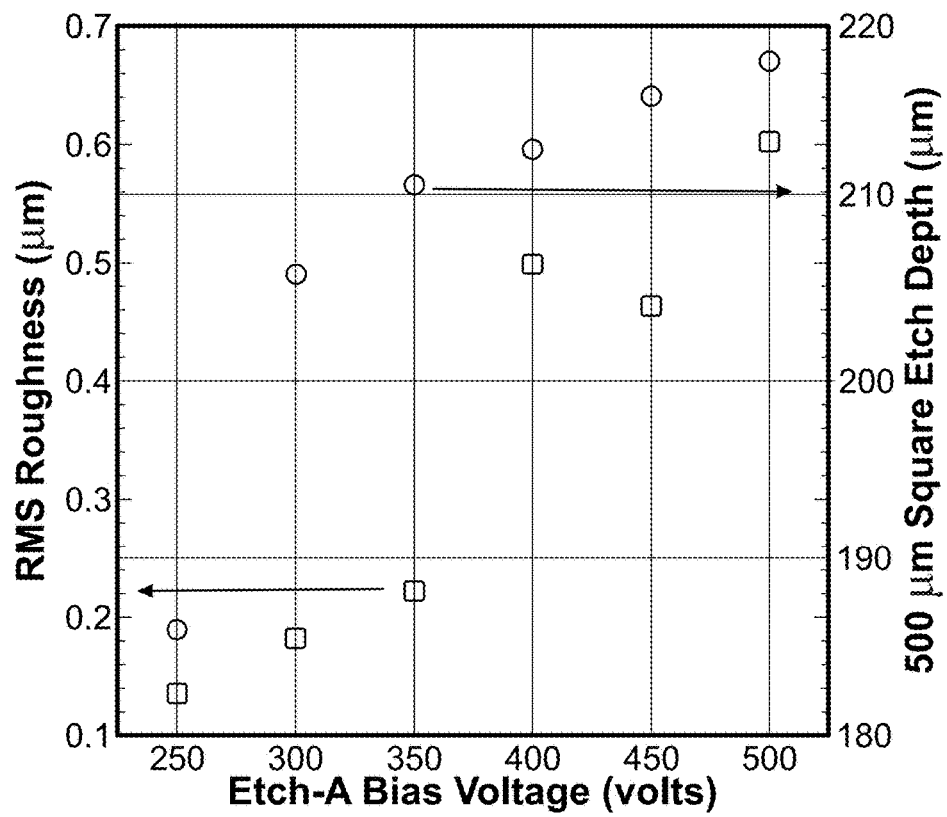
FIG. 4 illustrates the experimental surface roughnesses and substrate etch depths for a ScAlN etch mask as a function of etch-A bias voltage in accordance with one or more embodiments of the present invention.

As previously noted, one of the primary factors affecting the overall etching process is the etch-A bias, the effect of which was explored in the second experiment for Sc$_{0.125}$Al$_{0.875}$N etch masks. In this second experiment, the etch-A bias voltage was varied from 250 volts to 500 volts. The circles in FIG. 4 illustrate the impact changing the etch-A bias had on etch depth for a 500 μm square pattern with a 30 minute etch in each case. While the etch depth, and thus corresponding etch rate, increased with increasing etch-A bias, the increasing etch depth and rate was not linear, with an etch-A bias of 250 volts yielding a significantly shallower etch depth and lower etch rate. While yielding a shallower etch depth and lower etch rate, the etch-A bias of 250 volts also yielded the smoothest etched surface, as shown by the squares in FIG. 4. One may therefore trade-off etch rate for etched surface smoothness.

Figure 5:
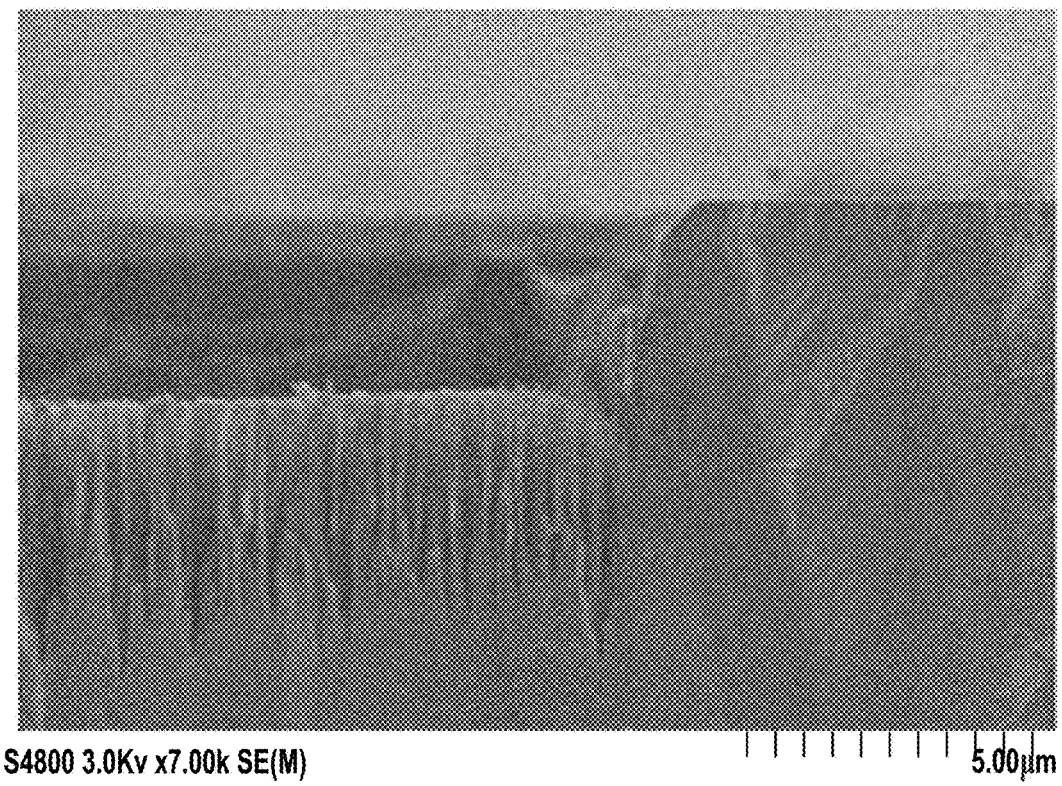
FIG. 5 is a photomicrograph of an opening etched into a SiC substrate with a ScAlN etch mask in accordance with one or more embodiments of the present invention.

In a third experiment, a Sc$_{0.125}$Al$_{0.875}$N etch mask was used when etching a SiC structure. The results of this experiment are shown in the photomicrograph of FIG. 5. While the primary etch depth is 2.76 μm, the etched surface is replete with much deeper channels. The third experiment employed a Sc$_{0.125}$Al$_{0.875}$N etch mask thickness of 762 nm. The Sc$_{0.125}$Al$_{0.875}$N etch mask etch rate was approximately 3 nm/min, while the SiC etch rate was approximately 92 nm/min, resulting in an etch mask selectivity of 31:1. While this is a far lower etch mask selectivity than that observed when etching a Si substrate (Knoop hardness of 1150), this etch mask selectivity is reasonable given the very physical nature of the etch when working with a much harder SiC substrate (Knoop hardness of 2480).

Figure 6A:
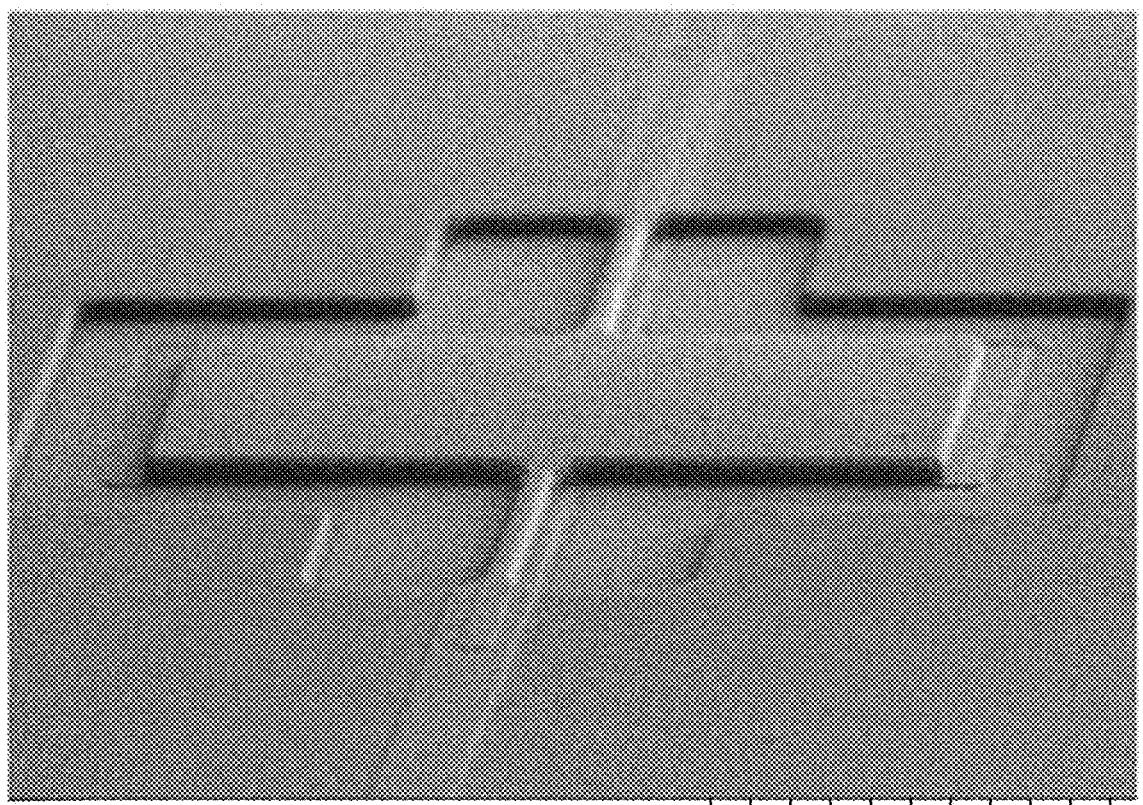
FIGS. 6A-6B are photomicrographs of an unreleased and released ScAlN piezoelectric resonator, respectively, formed with a ScAlN etch mask in accordance with one or more embodiments of the present invention.
Figure 6B:
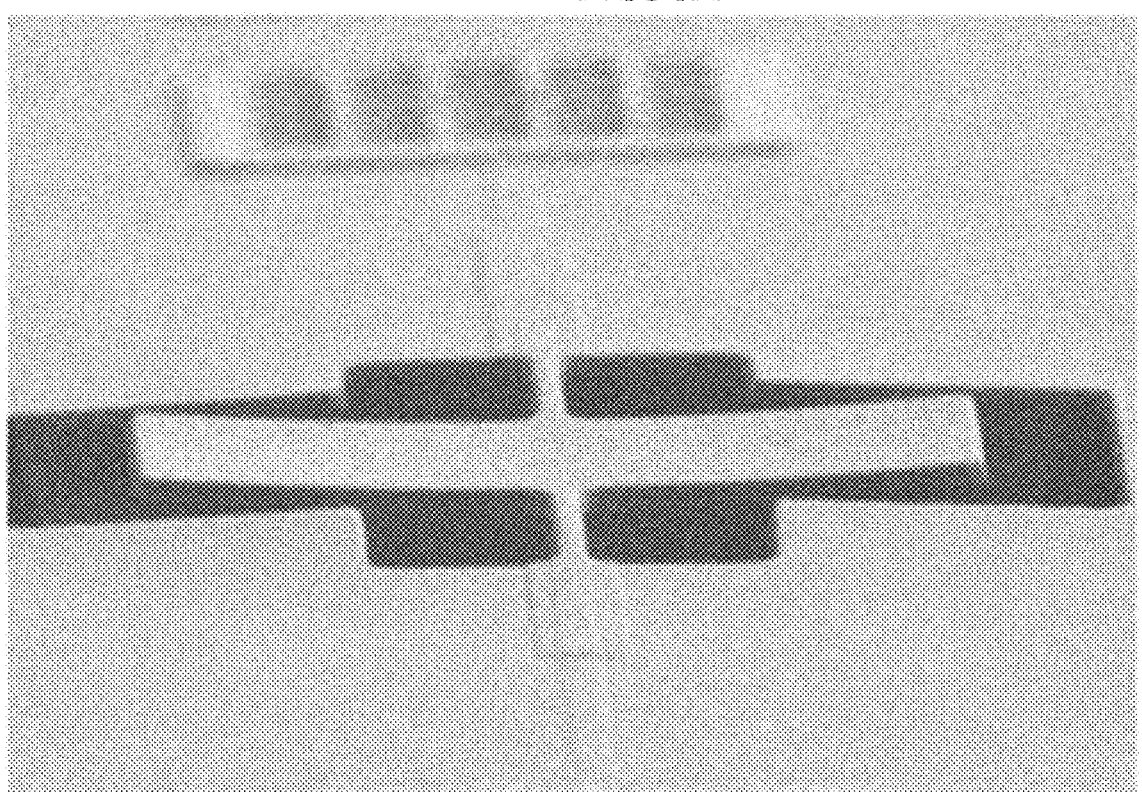

In a fourth experiment, a Sc$_{0.2}$Al$_{0.8}$N etch mask was used when etching a ScAlN piezoelectric material-based resonator structure. The results of this experiment are shown in the photomicrographs of FIGS. 6A and 6B. The ScAlN piezoelectric material-based resonator structure had a structure comprising, from top to bottom, a top contact layer formed of aluminum (Al), a ScAlN piezoelectric layer, a bottom contact layer formed of titanium (Ti)/titanium nitride (TiN)/Al, and a sacrificial silicon dioxide (SiO$_2$) layer, on an underlying silicon (Si) substrate. FIG. 6A shows the ScAlN piezoelectric material-based resonator structure before undergoing a MEMS device release step but after all device fabrication has been completed. FIG. 6B shows the ScAlN piezoelectric material-based resonator structure after being released due to XeF$_2$ etching of the Si substrate. As seen in FIG. 6B, the ScAlN piezoelectric material-based resonator structure has been cleanly etched through, including the ScAlN piezoelectric layer, with the underlying cavity in the Si substrate clearly evident. This step released the MEMS resonator structure with no obvious attack upon the ScAlN piezoelectric layer within the resonator structure.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for etching, the method comprising the steps of:
   providing a substrate;
   forming a layer of ScAlN etch mask material on a surface of the substrate;
   forming a ScAlN etch mask from the layer of ScAlN etch mask material, the ScAlN etch mask including at least one opening therethrough;
   etching the substrate through the at least one opening in the ScAlN etch mask using a fluorine-based etch chemistry; and removing the ScAlN etch mask from the surface of the substrate.

2. The method of claim 1, wherein the substrate is one of a semiconductor wafer, a processed semiconductor wafer, and a composite wafer.

3. The method of claim 1, wherein the step of forming the layer of ScAlN etch mask material includes a step of depositing ScAlN by physical vapor deposition or metal organic chemical vapor deposition.

4. The method of claim 1, wherein the step of forming the layer of ScAlN etch mask material includes a step of depositing ScAlN by sputtering a single ScAl target or co-sputtering separate Sc and Al targets.

5. The method of claim 1, wherein the step of forming the layer of ScAlN etch mask material includes the steps of:
depositing a high compressive stress layer of ScAlN; and
depositing a low compressive stress layer of ScAlN on the high compressive stress layer of ScAlN.

6. The method of claim 1, wherein the layer of ScAlN etch mask material includes at least approximately 12.5% Sc.

7. The method of claim 1, wherein a thickness of the layer of ScAlN etch mask material is between approximately 3 nm and approximately 10 μm.

8. The method of claim 1, wherein a thickness of the layer of ScAlN etch mask material is at least approximately 3 nm.

9. The method of claim 1, wherein the step of forming the ScAlN etch mask includes the steps of:
spinning a layer of photoresist onto the layer of ScAlN etch mask material;
exposing the layer of photoresist;
developing the thus exposed layer of photoresist, thereby exposing at least a portion of the layer of ScAlN etch mask material; and
removing the thus exposed at least a portion of the layer of ScAlN etch mask material, thereby creating the at least one opening in the ScAlN etch mask.

10. The method of claim 9, wherein the step of removing the thus exposed at least a portion of the layer of ScAlN etch mask material includes a step of at least one of reactive ion etching, tetramethylammonium hydroxide-based wet chemistry etching, and KOH-based wet chemistry etching of the thus exposed at least a portion of the layer of ScAlN etch mask material.

11. The method of claim 10, wherein if the step of removing the thus exposed at least a portion of the layer of ScAlN etch mask material includes the step of reactive ion etching, the step of reactive ion etching employs at least one of a chlorine-based chemistry process, a gas switching time multiplexed mode process, and a Bosch process.

12. The method of claim 1, wherein the step of etching the substrate includes a step of reactive ion etching the substrate through the at least one opening in the ScAlN etch mask.

13. The method of claim 12, wherein the step of reactive ion etching the substrate employs at least one of a deep reactive ion etching process, a gas switching time multiplexed mode process, and a Bosch process.

14. The method of claim 12, wherein the step of reactive ion etching the substrate employs backside He cooling of the substrate.

15. The method of claim 1, wherein the step of etching the substrate forms at least one physical feature or at least one physical element in the substrate.

16. The method of claim 1, wherein the step of etching the substrate etches completely through the substrate.

17. The method of claim 1, wherein the step of removing the ScAlN etch mask employs a tetramethylammonium hydroxide-based chemistry or a KOH-based chemistry.

* * * * *